(12) United States Patent
Adamec

(10) Patent No.: US 8,618,500 B2
(45) Date of Patent: Dec. 31, 2013

(54) MULTI CHANNEL DETECTOR, OPTICS THEREFOR AND METHOD OF OPERATING THEREOF

(75) Inventor: Pavel Adamec, Haar (DE)

(73) Assignee: ICT Integrated Circuit Testing Gesellschaft fur Halbleiterpruftechnik GmbH, Heimstetten (DE)

( * ) Notice: Subject to any disclaimer, the term of this patent is extended or adjusted under 35 U.S.C. 154(b) by 0 days.

(21) Appl. No.: 13/543,608

(22) Filed: Jul. 6, 2012

(65) Prior Publication Data

US 2013/0270439 A1   Oct. 17, 2013

(30) Foreign Application Priority Data

Apr. 16, 2012 (EP) .................................. 12164316

(51) Int. Cl.
*H01J 37/244* (2006.01)
*H01J 37/05* (2006.01)
*G01R 31/305* (2006.01)

(52) U.S. Cl.
USPC .......................................... 250/398; 250/310

(58) Field of Classification Search
USPC ................................................. 250/398, 310
See application file for complete search history.

(56) References Cited

U.S. PATENT DOCUMENTS

| | | | | |
|---|---|---|---|---|
| 4,803,357 A * | 2/1989 | Brust | ............................ | 250/310 |
| 5,644,132 A * | 7/1997 | Litman et al. | ................. | 250/310 |
| 6,184,526 B1 * | 2/2001 | Kohama et al. | ............... | 250/310 |
| 6,479,819 B1 * | 11/2002 | Hamashima et al. | ......... | 250/310 |
| 6,674,075 B2 * | 1/2004 | Petrov et al. | .................. | 250/310 |
| 6,979,818 B2 * | 12/2005 | Scheidemann et al. | ....... | 250/299 |
| 7,012,251 B2 * | 3/2006 | Nakasuji et al. | .............. | 250/310 |
| 7,045,781 B2 * | 5/2006 | Adamec et al. | ............... | 250/310 |
| 7,067,809 B2 * | 6/2006 | Lo et al. | ........................ | 250/310 |
| 7,205,559 B2 * | 4/2007 | Hamashima et al. | ...... | 250/492.3 |
| 7,274,018 B2 * | 9/2007 | Adamec et al. | ............... | 250/310 |
| 7,335,894 B2 * | 2/2008 | Frosien et al. | ............ | 250/396 R |
| 7,417,234 B2 * | 8/2008 | Hastings et al. | .............. | 250/397 |
| 7,439,500 B2 * | 10/2008 | Frosien et al. | ................ | 250/305 |
| 7,732,762 B2 * | 6/2010 | Nijkerk et al. | ................ | 250/310 |
| 7,741,601 B2 * | 6/2010 | Noji et al. | ..................... | 250/310 |
| 7,880,143 B2 * | 2/2011 | Tanimoto et al. | ............. | 250/310 |
| 8,203,119 B2 * | 6/2012 | Degenhardt et al. | .......... | 250/307 |

(Continued)

FOREIGN PATENT DOCUMENTS

EP     0242993 A1   10/1987

OTHER PUBLICATIONS

European Search Report dated Oct. 4, 2012 for European Application No. 12164316.7 EESR.

*Primary Examiner* — David A Vanore
(74) *Attorney, Agent, or Firm* — Patterson & Sheridan, LLP

(57) ABSTRACT

A secondary charged particle detection device for detection of a signal beam is described. The device includes a detector arrangement having at least two detection elements with active detection areas, wherein the active detection areas are separated by a gap, a particle optics configured for separating the signal beam in a first portion of the signal beam and in at least one second portion of the signal beam, configured for focusing the first portion of the signal beam, and configured for deflecting and focusing the at least one second portion of the signal beam, wherein the particle optics includes a first electrode and at least one second electrode. Therein, the first electrode is an inner electrode and the at least one second electrode is provided radially outward of the first electrode.

20 Claims, 11 Drawing Sheets

(56) References Cited

U.S. PATENT DOCUMENTS

| | | | |
|---|---|---|---|
| 8,207,499 B2* | 6/2012 | Shoham et al. | 250/307 |
| 8,350,214 B2* | 1/2013 | Otaki et al. | 250/310 |
| 8,373,136 B2* | 2/2013 | Schoenecker et al. | 250/396 R |
| 8,481,962 B2* | 7/2013 | Kneedler | 250/397 |
| 2004/0065827 A1* | 4/2004 | Kienzle et al. | 250/311 |
| 2008/0035861 A1* | 2/2008 | Knowles et al. | 250/492.3 |
| 2010/0320382 A1* | 12/2010 | Almogy et al. | 250/307 |
| 2013/0015351 A1* | 1/2013 | Kooijman et al. | 250/307 |

* cited by examiner

MULTI CHANNEL DETECTOR, OPTICS THEREFOR AND METHOD OF OPERATING THEREOF

FIELD

Embodiments of the invention relate to charged particle beam devices, for example, for inspection system applications, testing system applications, lithography system applications, defect review or critical dimensioning applications or the like. They also relate to methods of operation thereof. Further, embodiments of the invention relate to applications having a charged particle path for secondary particles, e.g. for electron beam inspection (EBI). Specifically, embodiments of the invention relate to charged particle units, to charged particle detection devices, a charged particle beam device, a charged particle multi-beam device and methods of operating theses devices.

BACKGROUND

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Besides resolution, throughput is an issue of such devices. Since large substrate areas have to be patterned or inspected, throughput of, for example larger than $10\ cm^2/min$ are desirable. In charged particle beam device, the throughput depends quadratically on the image contrast. Thus, there is a need for contrast enhancement.

High resolution electron optics systems require a short working distance between the objective lens and the wafer. Secondary electron collection is therefore typically done inside the column above the objective lens. A configuration commonly found in prior-art electron-beam imaging systems is shown schematically in FIG. 1. A column having length 104 including an emitter 105, an objective lens 10 and an annular secondary-electron detector 115, are spaced at a working distance 120 from a specimen 125. Primary electron beam 130 from emitter 105 is directed at specimen 125 through an opening 135 in annular detector 115. Secondary electrons 140 are emitted from specimen 125 in a broad cone surrounding primary beam 130. Some of secondary electrons 140 are collected by detector 115 to produce a secondary-electron (SE) signal 145.

Further, it is desired for many applications that the imaging information is increased while high-speed detection is provided. For example, upon irradiation of a sample by a primary beam of electrons, secondary electrons (SE) are created which carry information about the topography of the sample, its chemical constituents, its electrostatic potential and others. High speed detection provided with topography information and/or information on the energy of the secondary particles is a challenging task, for which continuous improvement is desired. Accordingly, improvements of the detection in the SEM-based tools, particularly in high throughput defect inspection or review tools, is desired. Additionally or alternatively, separation of several signal beam bundles, e.g. with reduced cross-talk, is desired for detection of topography imaging or the like.

SUMMARY

According to one embodiment, a secondary charged particle detection device for detection of a signal beam is provided. The device includes a detector arrangement having at least two detection elements with active detection areas, wherein the active detection areas are separated by a gap, a particle optics configured for separating the signal beam into a first portion of the signal beam and into at least one second portion of the signal beam, configured for focusing the first portion of the signal beam, and configured for deflecting and focusing the at least one second portion of the signal beam, wherein the particle optics includes a first electrode, and at least one second electrode, wherein the first electrode is an inner electrode and the at least one second electrode is provided radially outward of the first electrode.

According to another embodiment, charged particle beam device is provided. The device includes a charged particle beam source for providing a primary charged particle beam, a first focusing element for focusing the primary charged particle beam on the specimen, wherein a signal beam is generated, and a charged particle detection device. The detection device includes a detector arrangement having at least two detection elements with active detection areas, wherein the active detection areas are separated by a gap, a particle optics configured for separating the signal beam into a first portion of the signal beam and into at least one second portion of the signal beam, configured for focusing the first portion of the signal beam, and configured for deflecting and focusing the at least one second portion of the signal beam, wherein the particle optics includes a first electrode, and at least one second electrode, wherein the first electrode is an inner electrode and the at least one second electrode is provided radially outward of the first electrode.

According to a further embodiment, charged particle multi-beam device is provided. The charged particle multi-beam device includes at least two charged particle beam devices. Each of the two devices includes a charged particle beam source for providing a primary charged particle beam, a first focusing element for focusing the primary charged particle beam on the specimen, wherein a signal beam is generated, and a charged particle detection device. The detection device includes a detector arrangement having at least two detection elements with active detection areas, wherein the active detection areas are separated by a gap, a particle optics configured for separating the signal beam into a first portion of the signal beam and into at least one second portion of the signal beam, configured for focusing the first portion of the signal beam, and configured for deflecting and focusing the at least one second portion of the signal beam, wherein the particle optics includes a first electrode, and at least one second electrode, wherein the first electrode is an inner electrode and the at least one second electrode is provided radially outward of the first electrode.

According to yet another embodiment, a method of operating a detection device is provided. The method includes biasing a first electrode and at least one second electrode of a particle optics, wherein the first electrode is an inner electrode and the at least one second electrode is provided radially outward of the first electrode, and detecting a signal beam with a detector assembly having at least one detection element corresponding to the inner electrode and at least one detection element corresponding to the at least one outer electrode.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE DRAWINGS

Figure 1:
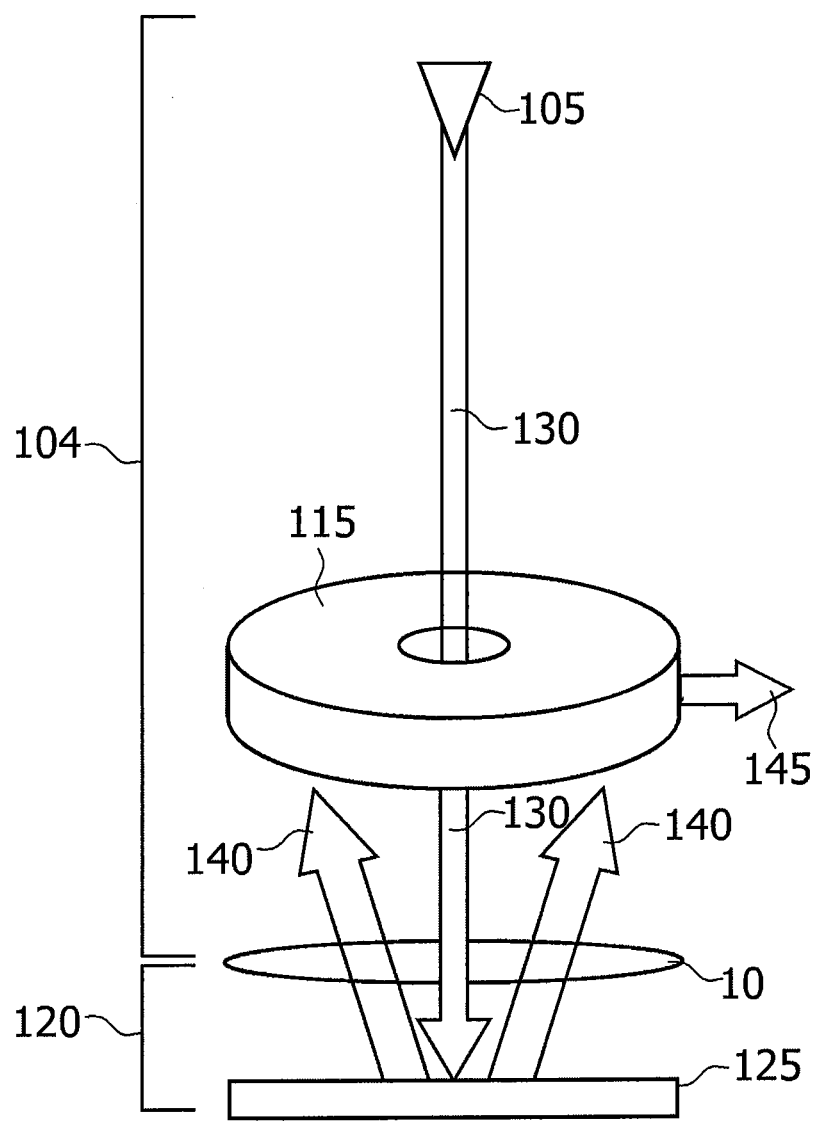
FIG. 1 shows schematically a detection scheme according to the state of the art.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device including the detection of secondary electrons. Embodiments of the present invention can still be applied for apparatuses and components detecting corpuscles, such as secondary and/or backscattered charged particles in the form of electrons or ions, photons, X-rays or other signals in order to obtain a specimen image. Generally, when referring to corpuscles they are to be understood as light signals in which the corpuscles are photons as well as particles, in which the corpuscles are ions, atoms, electrons or other particles.

According to embodiments herein, which can be combined with other embodiments, a signal beam is referred to as a beam of secondary particles or a secondary beam, i.e. secondary and/or backscattered particles. Typically, the signal beam or secondary beam is generated by the impingement of the primary beam on a specimen. A primary beam is generated by a charged particle beam source and is guided and deflected on a specimen to be inspected or imaged.

A "specimen" as referred to herein, includes, but is not limited to, semiconductor wafers, semiconductor workpieces and other workpieces such as memory disks and the like. Embodiments of the invention may be applied to any workpiece on which material is deposited or which is structured. A specimen includes a surface to be structured or on which layers are deposited; an edge or typically a bevel. According to some embodiments, which can be combined with other embodiments described herein, the apparatus and methods are configure for or are applied for electron beam inspection, for critical dimensioning applications and defect review applications.

Generally, when referring to focusing a charged particle beam, it is understood that the beam of charged particles is reduced in divergence. This means the charged particles of a beam are focused or at least collimated towards a subsequent beam optical element to decrease losses of charged particles due to divergence or due to blocking of charged particles. Correspondingly, defocusing is understood as increasing the divergence.

For defect inspection tools and review tools or critical dimensioning tools an enhanced contrast, for example a topography contrast, can be generated by detecting secondary particles depending on their starting angle. Thereby, enhanced contrast of the inspected features and/or defects can be obtained. For detection of the secondary particle beam depending on the starting angle, separation of the secondary beam to individual detection elements or detection is provided. However, particularly for high-speed detection applications, as referred to in embodiments described herein, manufacturing of a sensor with individual segments, which are closely packed without dead area between them, i.e. which do not have a significant gap between the sensor elements, is difficult.

Figure 2A:
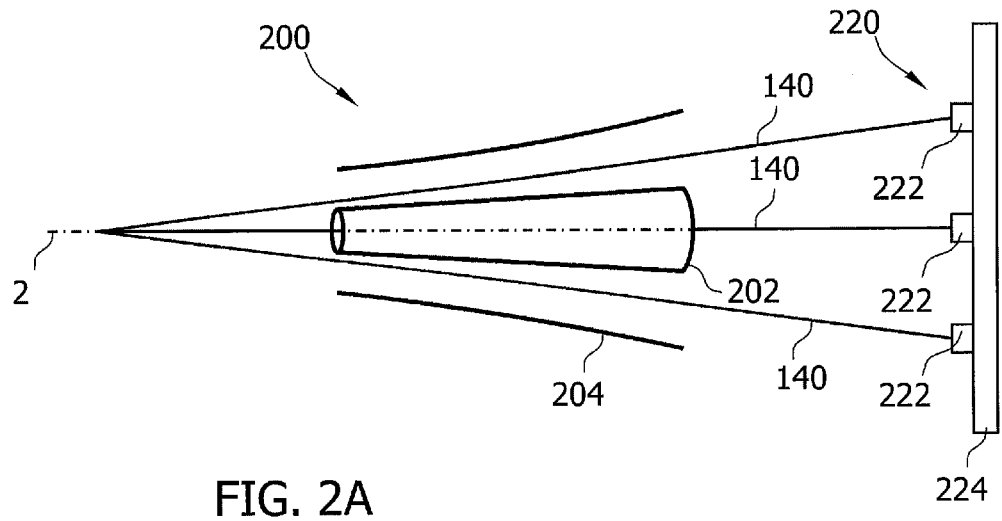
FIGS. 2A and 2B illustrate a secondary particle optics and a detection assembly according to embodiments described herein.

FIG. 2A shows a detector arrangement 220, with detection elements 222. As can be seen in FIG. 2A, the detection elements 222 are separated from each other by a gap between the detection elements 222. The detection elements 222 are supported by a holder 224 of the detector arrangement 220.

According to typical embodiments, which can be combined with other embodiments described herein, the separation, i.e. the gap between the detection elements 222, has at least the same length in the corresponding dimension as the active area of the detection elements 222. For example, the gap has at least 0.05 times the length of the active detection area in the corresponding direction. Typically, the gap can be in a range of 100 µm to 500 µm. The size of one dimension of the detection area can be 1 mm to 5 mm. According to yet further optional alternative embodiments, the gap can be in a range of 1 mm to 10 mm. A typical ratio G/L of the gap and the corresponding length of active area, which can be utilized alternatively or additionally to the above-mentioned gap dimension, can be 1 or above and 7 or below.

According to yet further embodiments, which can be combined with other embodiments described herein, the detection elements 222 can be PIN-diodes which are used as the sensor for detecting secondary particles, for example secondary electrons. According to yet further embodiments, which can be combined with other embodiments described herein, the devices and methods for separation of the signal beam traveling along optical axis 2 can also be utilized for other detectors, e.g. detector assemblies including a scintillator, an avalanche photo diode or the like.

As described herein, secondary particles or secondary electrons are understood as either backscattered particles/electrons or particles/electrons, which are generated due to impingement of the primary charged particle beam on the specimen.

PIN-Diodes can be used for high-speed detection applications in light of their large bandwidth, for example in the range of 0.5 to 5 Gigahertz, or 2 GHz or above. Thereby, the active area of the Pin-diodes limits the detection speed. That is, the larger the active area of the pin diode the slower the detection speed.

Accordingly, the active area of the pin diodes is reduced to an area of 2 mm$^2$, or below or even of 1 mm$^2$ or below, in order to provide the desired detection speed of a bandwidth of 0.5 GHz or above or 1 GHz or above. The size of the active area of the detection element 222 delimits the ratio of the detection area as compared to the gaps there in-between. Accordingly, the detector arrangement 220 having a desired bandwidth for high-speed detection is provided with the gaps between the active areas of the detection elements. Accordingly, a spatial separation, which is dictated by the design of the detection elements 222, is given.

According to embodiments described herein, a secondary particle optics 200 is provided. The secondary particle optics can be a beam splitting device which is provided in front of the sensor. For example, the secondary particle optics 200 is an electro-optical beam splitting device. According to embodiments described herein, the secondary electron optics 200 includes deflection elements and focusing elements for deflecting and focusing the secondary beam to the detection elements 222, i.e. to the detection channels of the detector arrangement 220. Thereby, each detection element 222 of the detector arrangement 220 can be hit by a predetermined portion of the secondary beam. In light of the deflection and focusing properties, this can be done without significant losses of secondary particles in the dead areas or gaps between the active areas of the detection elements 222.

Figure 2B:
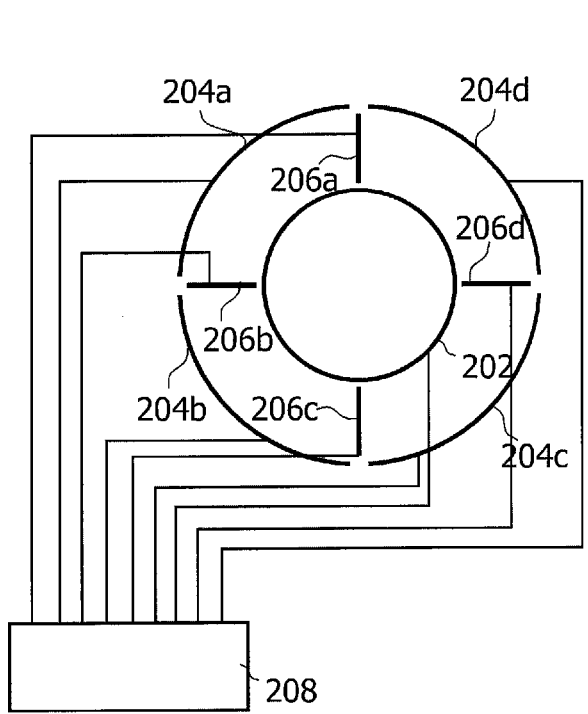

As shown in FIGS. 2A and 2B, the secondary beam optics 200 or the beam separation device includes a central electrode 202 and one or more outer electrodes 204, for example electrodes 204a to 204d. According to typical embodiments, which can be combined with other embodiments described herein, the central electrode can be an axially symmetric part, for example in the form of a tube, a cone, or another cylindrical- or cone-shaped form with a cross-sectional shape of a circle, square, rectangle, hexagon, or another shape. The central electrode 202 is configured for a central detection element 220 (see FIGS. 2A and 2C). The one or more outer electrodes 204 are configured for outer detection elements 222.

Figure 2C:
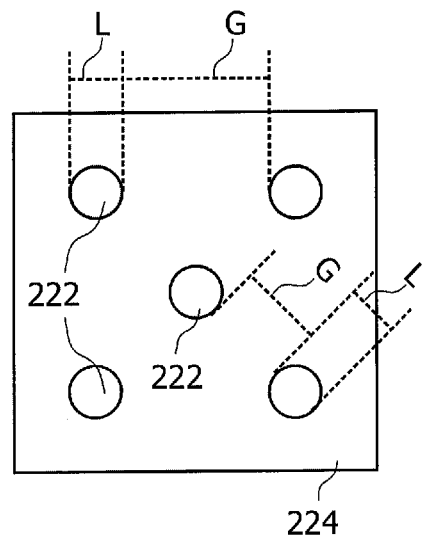
FIG. 2C illustrates a view of a detector arrangement according to embodiments described herein.

As shown in FIG. 2C, the detector arrangement 220 has five detection elements 222, which correspond to the areas of the secondary beam optics 200 shown in FIG. 2B. According to typical embodiments, which can be combined with other embodiments described herein, five areas and corresponding detection elements 222 are provided. Thereby, a central area and a central detection element and four outer areas and four outer detection elements can be provided. Accordingly, the secondary particles released from the specimen can be discriminated by the starting angle, i.e. either the central detection element detects the secondary particle or an outer detection element detects the secondary particle. Further, separation of the direction of the starting angle can be provided for the larger starting angles, which correspond to an outer area. Thereby, depending on which of the outer detection elements or channels of the detector arrangement measures the secondary particles, the direction of the starting angle can be determined.

According to yet further embodiments, which can be combined with other embodiments described herein, also 6, 8, 12 or even more outer areas can be provided between the inner electrode 202 and one or more outer electrodes 204. Thereby, a corresponding number of separation walls can also be provided.

FIG. 2C further illustrates the size of the detection areas, which are indicated by reference L, as compared to the gap G between the active detection areas. Accordingly, the detector arrangement 220 has dead areas between the active areas of the detection elements. As described above, this is due to the size of the active area of the sensor corresponding inversely to the bandwidth of the detector arrangement.

As shown in FIG. 2B, a voltage supply assembly 208 is provided and is in electrical connection with the respective electrodes of the secondary beam optics 200. According to typical embodiments the voltage supply assembly can include one or more voltage supplies, which might or might not be provided in a common housing. Typically, the inner electrode 202, the one or more outer electrodes 204 and the separating walls 206 can each be connected with a respective common voltage supply, i.e. the voltage supply assembly 208 can include three voltage supplies or can be configured for providing three independently controllable voltages. Yet, it is also possible that each electrode is connected to an individual voltage supply or that the voltage supply assembly can provide an individual voltage to each electrode. For the example shown in FIG. 2B, this would correspond to nine voltage supplies or nine voltages respectively.

According to some embodiments, which can be combined with other embodiments described herein, the outer detection area between the inner electrode 202 and the at least one outer electrode 204 can be separated by separating walls 206. FIG. 2B shows exemplarily four separating walls 206a to 206d. Thereby four outer areas are provided. According to yet further optional implementations thereof, the outer electrode 204 can also be provided by four separate outer electrodes 204a to 204d.

The inner electrode 202 provides a focusing of the central portion of the secondary being when the central electrode 202 is biased to the desired potential. According to typical embodiments, which can be combined with other embodiments described herein, the central potential can be in the range of 0V to negative potential equal to the beam energy, for example 20 to 40 keV. Further, the outer area or the outer areas can provide a deflection for separating the secondary particles with large starting angle and a focusing of the respective portion, or portions, of the secondary beam. The outer areas are thereby biased to the potential of, for example, 500V to 5 kV positive with respect to central area. The outer electrode 204, or the respective portions 204a to 204d thereof, can also have a cone-like shape or a bended shape.

Thereby, cone-shaped or bended electrodes are provided as outer electrodes and an electrode arrangement comparable to a sector device for bending a beam can be provided. Yet, as compared to a sector device for bending a beam along curved electrodes, the deflection angles of the secondary beam optics 200 is smaller. For example, the deflection angles can be in the range of 5° to 30°. Further details of sector elements and their implementation are described with respect to FIGS. 5A and 5B.

The secondary beam optics 220 as shown in FIGS. 2A and 2B have a comparable functionality with a smaller deflection angle. Accordingly, according to embodiments described herein which can be combined with other embodiments described herein, the outer areas between the inner electrode 202 and the one or more outer electrodes 204 can also provide a focusing action in one or two directions. For example, for embodiments having separating walls 206 the focusing action can be provided in two dimensions. Thereby, the collection efficiency of secondary particles on the active areas of the detection elements 222 can be further improved by providing a lateral focusing action for each outer detection segment.

According to yet further embodiments, which can be combined with other embodiments described herein, the central electrode can have a square, rectangular, hexagonal, a circular, or any other desired shape. The outer electrodes might be formed by a single electrode 204 with a common voltage, or by separated electrodes 204a to 204d with a common voltage, or with individual voltages. The separating walls 206a to 206d can have different positions, shape or voltage. For example, they can be biased to the potential of 500V to 5 kV negative with respect to central area.

According to yet further embodiments, which can be combined with other embodiments described herein, two, three, four, five, six, or even more separating walls 206 can be provided. Typically, the number of separating walls will provide a number of outer detection areas, which correspond to the number of detection elements 222 in the detector arrangement 220. According to typical examples, the inner electrode, the one or more outer electrodes and the one or more separating walls can be provided to three different potentials, wherein each of the inner electrode, the outer electrode and the separating walls are provided on the common potential.

According to some embodiments, which can be combined with other embodiments described herein, the length of the inner electrode 202 and/or the outer electrode 204 along the axis 2 of the secondary beam path can be in the range of 10 mm to 20 mm. The diameter (or a corresponding dimension for other shapes) of the inner electrode can be in the range of 1 mm to 5 mm. The diameter, or a corresponding dimension of the outer electrode 204, can be in the range of 3 mm to 20 mm. Thereby, an inner portion of the secondary electron beam is guided to the central area within the central electrode 202 and an outer portion is provided in the outer area between central electrode 202 and the at least one outer electrode 204.

According to yet further embodiments, the secondary particle optics 200 can additionally include a focus lens 301 configured for focusing the secondary particles. Thereby, a generally divergent secondary particle beam can be focused to pass through the inner electrode 202 and to be detected at the central detection element 222. According to yet further embodiments, which can be combined with other embodiments described herein, the focus lens 301 can be switched off or can be operated such that the secondary particles are formed to a beam diameter adapted to the size of the separation optics. Thereby, the secondary particles pass through all of the aperture openings. In light of the above, topography contrast and central BF imaging can be realized.

According to embodiments described herein, the detection device can analyze the angular and energetic information contained in a bundle of secondary particles, e.g. SEs. Thereby, the energetic information can be provided by biasing the electrodes to a potential such that only particles with a sufficiently high energy can pass through electrodes. The focus lens 301 allows for adjusting the opening angle of the signal beam. The beam can be made divergent or convergent as required. Thereby, collection efficiency of secondary particles can be improved. Further, switching between a topography imaging mode and a signal detection channel image mode can be provided.

According to embodiments described herein, the secondary beam optics 200 are utilized for charged particle beam devices, wherein a secondary beam or signal beam is separated from the primary beam, i.e. the primary beam is guided on the specimen for impingement of the primary beam thereon and the resulting generation of the signal beam or secondary beam.

There are two principle methods for separating the primary and secondary electron beams, both of which take advantage of the fact that the force on a moving electron traversing a magnetic field is dependent upon the electron's velocity. This is a fundamental principle described by the Lorentz force law. Since the primary electrons and secondary electrons are essentially traveling in opposite directions, the force acting upon the two bundles will be opposite in direction when traveling through a transverse magnetic field.

Figure 3A:
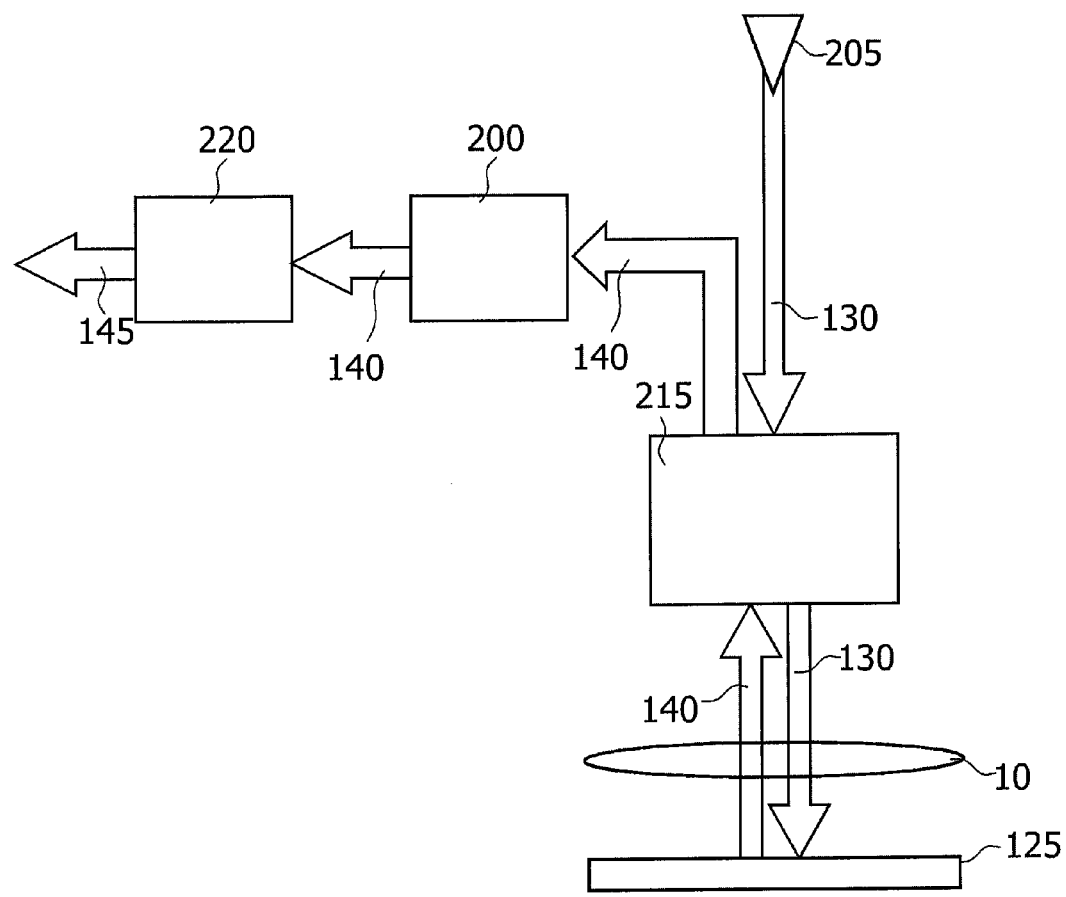
FIG. 3A shows a schematic view of a system, which can be utilized for a secondary particle optics and a detection assembly according to embodiments described herein, having a Wien filter type separating unit.

One possible beam separator is the Wien filter. A Wien filter arrangement in accordance with an embodiment of the invention is shown schematically in FIG. 3A. An emitter 205 emits a primary-electron beam 130 which passes through Wien-type momentum-dispersive filter 215 and is focused by objective lens 10 on a sample 125. Secondary-electron beam 140 passes through objective lens 10 and Wien-type filter 215 in a direction opposite to that of primary-electron beam 130. The Wien filter can be adapted such that the primary-electron beam 130 passes unaffected by Wien filter 215, while secondary-electron beam 140 is bent as it passes through Wien filter 215 so that it exits the column inclined with respect to primary-electron beam 130. Once separated from the primary-electron beam, the secondary electrons can be focused and filtered, e.g., by secondary-electron optics 200, a charged particle unit for deflecting and focusing charged particles, without any effect on the primary-electron beam. Electron detector 220 detects the secondary electrons and produces a secondary-electron signal 145 for each of the detection elements 220, i.e. for each of the detection channels. Though the primary beam and the secondary beam actually occupy the same physical space above the specimen plane, they are drawn as separate arrows in FIG. 3A for convenience of illustration.

The Wien filter uses crossed electric and magnetic fields, the amplitudes of which are adjusted so that there is zero net force on the primary beam and a deflection (transverse) force on the secondary beam.

Figure 3B:
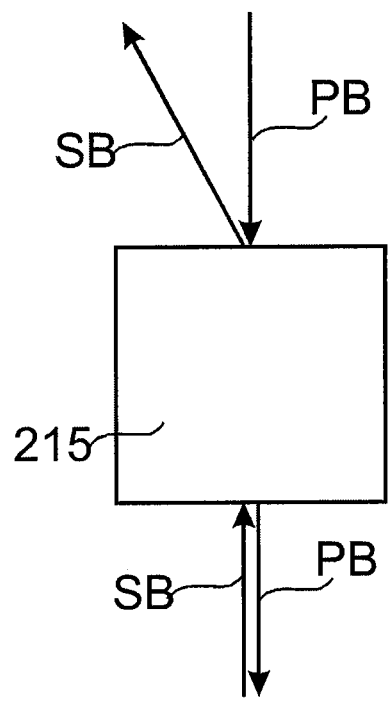
FIGS. 3B and 3C show schematically other beam paths that may be realized with a Wien filter type separating unit.
Figure 3C:
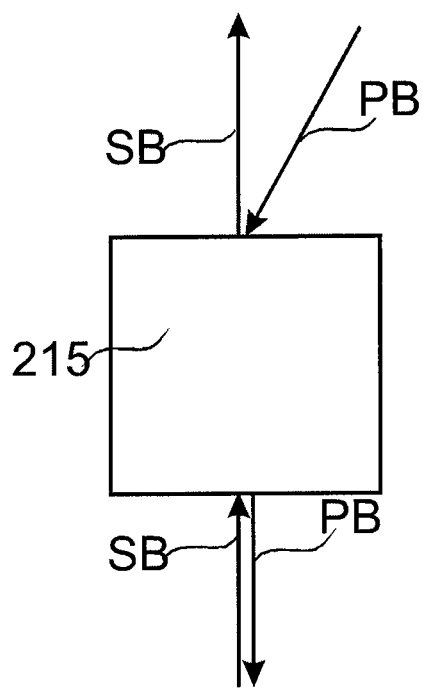

Schematic views of the usage of a Wien filter 215 are further shown in FIGS. 3B and 3C. Thereby, the electric and magnetic fields within the Wien filter are adjusted such that in FIG. 3B the primary charged particle beam is unaffected. Contrary thereto, within FIG. 3C the electric and magnetic fields are adjusted such that the secondary charged particle beam is unaffected. Nevertheless, both embodiments utilize the separation of the primary and secondary beam. Thus, focusing or filtering can be applied to the beam of secondary charged particles without influencing the primary charged particle beam. According to a further option (not shown) it is further possible that both beams are deflected to some degree, whereby a beam separation is achieved.

Figure 4A:
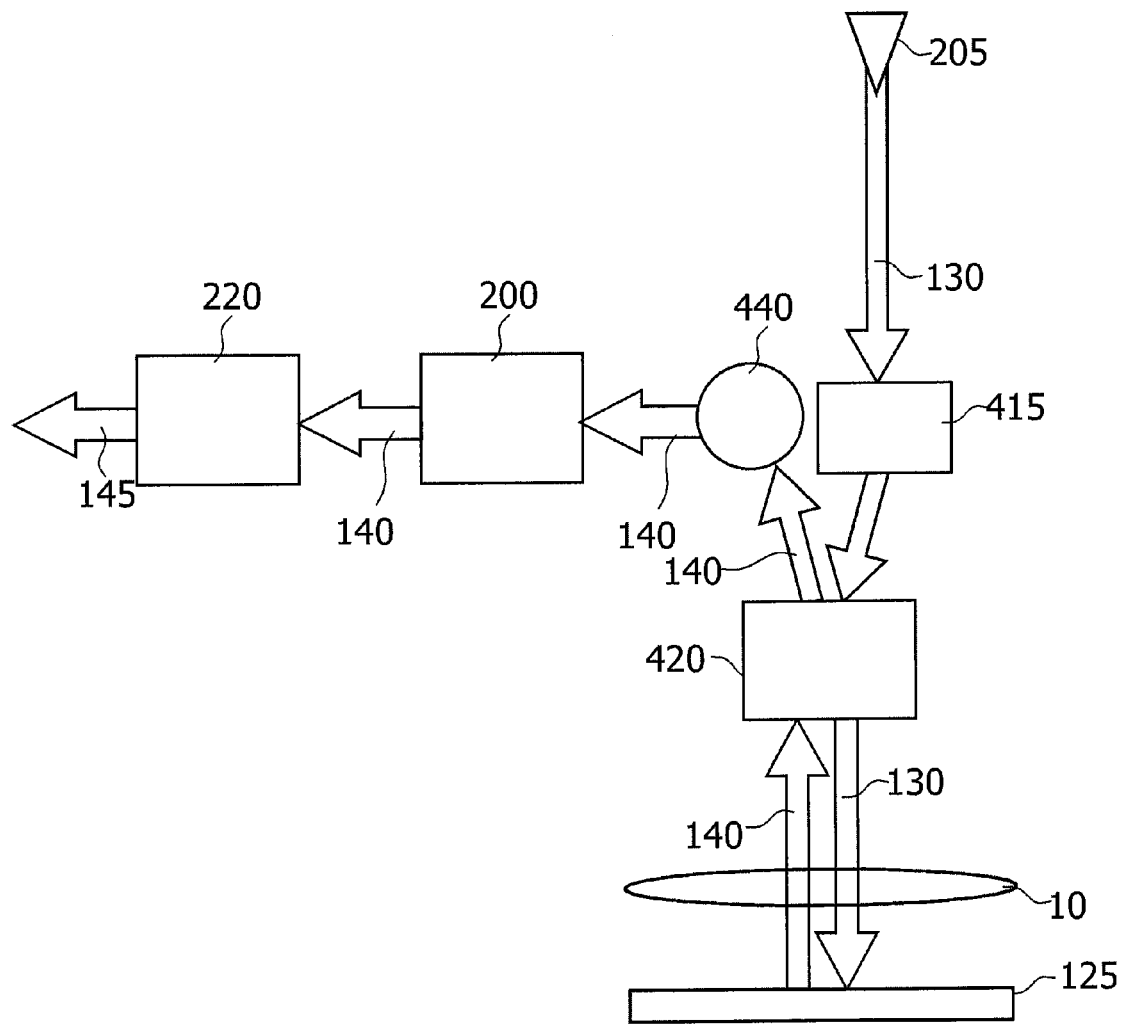
FIG. 4A shows a schematic view of embodiments, which can be utilized for a secondary particle optics and a detection assembly according to embodiments described herein, having a magnetic dipole beam separating unit.

Another method of separating the primary and secondary beams is to use magnetic deflection without an electric field. FIG. 4A shows schematically an arrangement of magnetic-beam separator optics in accordance with an embodiment of the invention. Emitter 205 produces a primary-electron beam 130 which is first deflected by the first magnetic deflector 415 such that primary-electron beam 130 enters a second magnetic deflector 420 at an angle. To keep the effect of the magnetic beam separator on the primary beam small, the angle of deflection in the first magnetic deflector 415 should be kept below 10 degrees. Primary-electron beam passes through the second magnetic deflector 420 and is directed at specimen 125. Secondary electrons of beam 140 are then deflected by the second magnetic deflector 420 such that the total angle α of separation of primary beam 130 and secondary beam 140 is roughly twice that of the deflection of the primary beam in the first magnetic deflector 415 (15-20 degrees). This separation is enough to allow for a beam bender, sector 440, to be mechanically isolated from primary beam 130 and to be made strong enough to deflect secondary beam 140 so that the secondary electrons are now traveling with a large angle, that is between 30° and 100°, with respect to the primary beam.

Generally, sectors that might be combined with the embodiments disclosed herein might be electrostatic, magnetic or combined electrostatic-magnetic. Since the space required for an electrostatic sector is smaller than the space for a sector including a magnetic part, typically an electrostatic sector is used.

Following sector 440, which already has conducted a reduction of divergence (focusing) at least in one dimension, is a set of secondary-electron optics 200, which additionally focuses and deflects the secondary beam depending on the starting angle of the secondary electrons. Noteworthy is that this configuration may result in a shifted column; that is, the upper portion of the primary beam optics (e.g., emitter 205 and part 1 magnetic deflector 415) is shifted laterally from the lower portion (e.g., part 2 magnetic deflector 420 and objective lens 10). Thus, emitter 205 does not have line-of-sight view of specimen 125. After passing through secondary-electron optics 200, secondary-electron beam 140 is detected by electron detector assembly 220 to produce a secondary-electron signal 145 for each of the detection elements or each of the detector channels respectively.

To achieve large angle beam separation a beam bender or sector after the beam separator can be used. The primary beam is completely shielded and therefore unaffected by the sector fields. Sector 440 can be either electrostatic, magnetic or both. An electrostatic beam bender is used where space is a consideration.

Figure 4B:
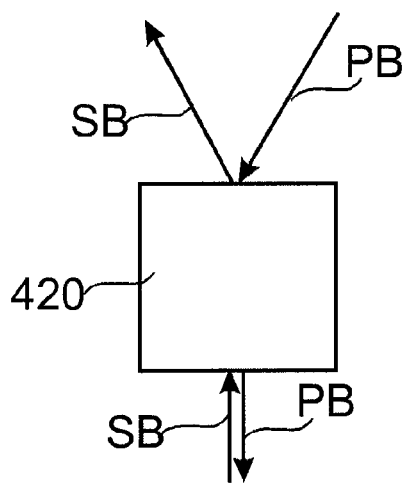
FIGS. 4B to 4D show schematically other beam paths that may be realized with a magnetic dipole beam separating unit.
Figure 4C:
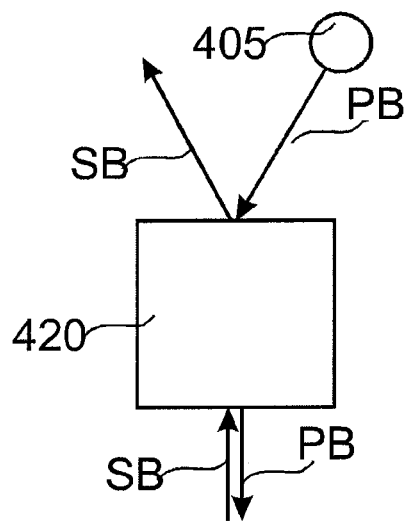

FIG. 4A refers to the specific embodiment realized with a magnetic deflector affecting the primary and the secondary charged particle beam. FIGS. 4B to 4C show schematically applications which can be realized in general. These beam paths may be combined with any other details of other embodiments.

Therein, a magnetic deflector 420 is shown. Within FIG. 4B the primary charged particle beam enters the magnetic deflector under a defined angle of incidence; and is deflected towards a specimen. The beam of secondary electrons, which are released from the specimen, enters the magnetic deflector on its way back towards the optical column and is deflected such that the primary charged particle beam and the secondary charged particle beam are separated. The magnetic deflector 420 acts as a separating unit between the primary and the secondary charged particle beam.

Figure 4D:
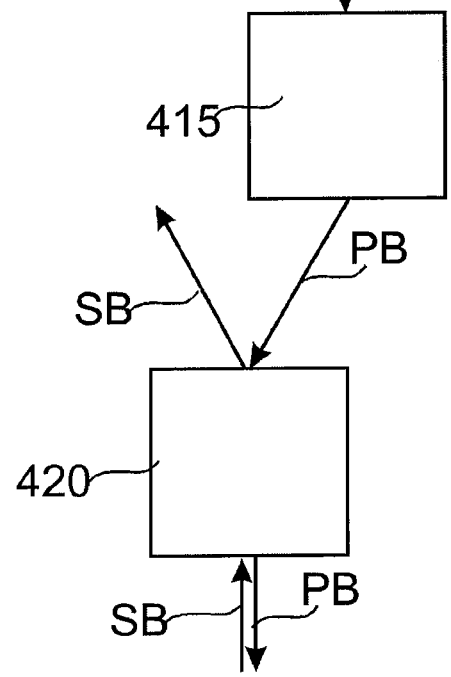

The general usage shown in FIG. 4B can be applied for different embodiments which are shown in FIGS. 4C and 4D. In FIG. 4C, the gun 405 emitting the electrons is tilted with respect to the electron direction on impingement on a specimen. If a parallel primary electron beam direction of emitted electrons and of electrons impinging on a specimen is required, a further magnetic deflector 415 may be used to compensate for the beam-tilt introduced by magnetic deflector 420. Again, these schematic beam paths can be combined with any other embodiments showing further details of the charged particle optics.

Figure 5A:
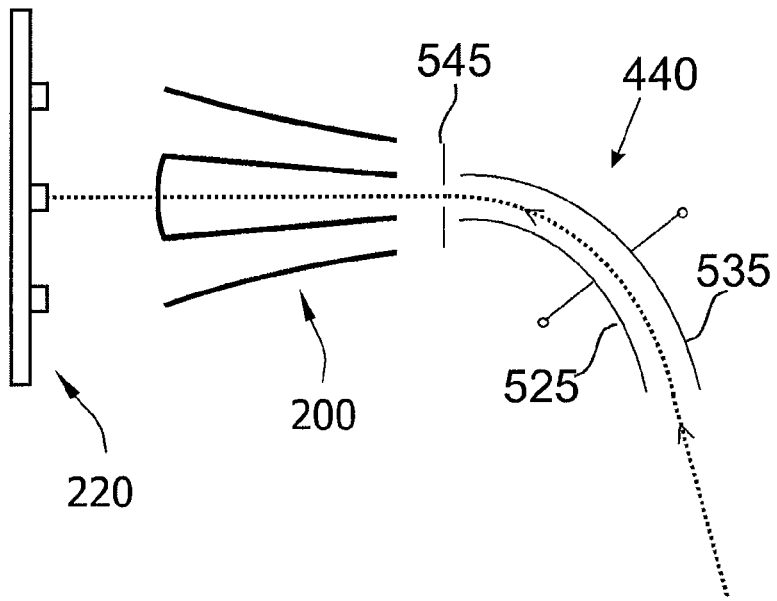
FIGS. 5A and 5B show schematic side views of charged particle units according to embodiments described herein.

Further embodiments will be described with respect to FIGS. 5A and 5B. FIG. 5A shows a sector 440. Sector 440 has a negatively-charged U-bend 535 and a positively-charged U-bend 525 serving to bend the electron beam. Optionally, a pair of sector side plates can be provided. Thereby, the electron beam is focused in one dimension and, additionally, is kept at a high energy to avoid time of flight effects which may have impact on high-speed detection. A focusing in the second dimension takes place in quadrupole element 545. Thereby, the sector 440 and the quadrupole form a double-focusing sector unit. Further, it may be possible to use a cylinder lens instead of a quadrupole to obtain double focusing.

The electron beam enters secondary beam optics 200 as described herein. Thereafter a detection at high speed, and including a topography information correlated to the starting angle, can be detected by detector assembly 220.

Figure 5B:
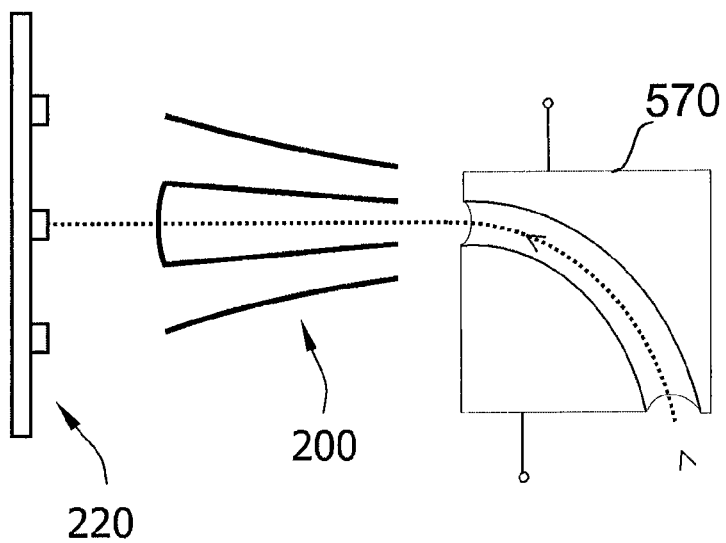

In the further embodiment of FIG. 5B a hemispherical sector 570 is used. In view of the hemispheric shape the electron beam entering the sector is focused in both dimensions. Thus, no additional focusing unit is required for the double-focusing sector unit 570. The secondary particles result in signal generations as described above.

According to a further embodiment (not shown) the focusing of the double focusing sector unit (440, 545 in FIG. 5A or 570 in FIG. 5B) can be assisted with an additional focusing unit. Thus, the double focusing sector unit may also include additional lenses, for example an Einzel-lens. This additional lens may also be applied to move the focus of the sector to a position corresponding to the position of the filter.

Figure 5C:
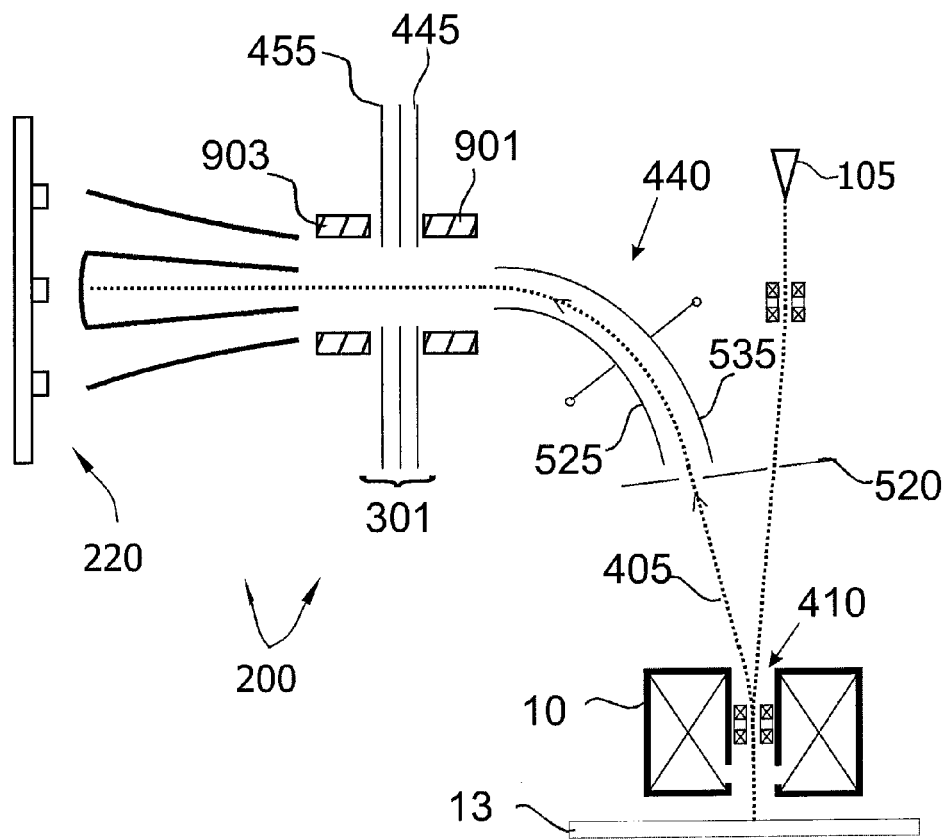
FIG. 5C shows a schematic side view of a charged particle beam device having a secondary particle optics and a detection assembly according to embodiments described herein.

A further aspect will now be described with respect to FIG. 5C, wherein the detection optics according to one embodiment are shown. FIG. 5C includes a sector 440 acting as a deflection angle increasing unit. The beam of secondary electrons, which has already been separated from the optical axis by an angle of for example 3° to 15°, is further deflected towards detector assembly 220.

Generally, an electrostatic beam bender can be either cylindrical or hemispherical. The cylindrical type suffers from the fact that as the beam is bent the secondary electrons are focused in one plane and not in the other. A hemispherical beam bender focuses the secondary beam in both planes. The cylindrical sector can be used with side plates biased to achieve focusing in the transverse plane, yielding similar focusing properties as the hemispherical sector.

FIG. 5C is a schematic view of such a cylindrical sector. Side plates (not shown) can be positioned—with respect to the perspective of this figure—in front of and behind the gap between the sector electrodes 525 and 535.

According to yet further embodiments, which can be combined with other embodiments described herein, the particle optics 200 can include further elements as illustrated in FIG. 5C. Particularly for EBI applications and other applications with a larger field of view where the scanning of the primary electron beam influences the detection, e.g. scanning areas of 50 μm to 50 μm and above, further optical elements can be utilized for the secondary optics 200. Thereby, the particle optics can shape the signal beam, e.g. the SE bundle, before the signal beam enters the beam splitting assembly of inner and outer electrodes. According to typical embodiments, which can be combined with other embodiments described herein, the particle optics can include the focus lens 301 and/or one or more deflection assemblies 901/903.

According to some embodiments, a focus lens can be provided. The focus lens focuses the signal beam on the central detection element to generate a bright field image. Alternatively, the focus lens focuses the signal beam onto a potential saddle in the central electrode, i.e. on the central detection element while the aperture plate is biased a biased to generate an energy filtered image. According to yet another alternative, the focus lens 301 can make the signal beam divergent or can adjust the divergence thereof such that the diameter of the signal beam is adjusted to the diameter of the electrode arrangement. Accordingly, the focus lens can be used to switch between different operation modes, i.e. imaging modes.

According to yet further embodiments, which can be combined with other embodiments described herein, the particle optics 200 can further include one or more deflection assemblies. Thereby, the deflection assemblies 901 and 903 can be controlled for aligning the signal beam, e.g. the SE bundle to the electrode arrangement. Additionally or alternatively, the deflections assemblies can be controlled for de-scanning the signal beam. That is a deflection (de-scan, anti-scan or counter-scan) is provided for compensate a movement of the signal beam based upon scanning of the primary beam, which generates the signal beam on impingement on a specimen.

According to typical embodiments, Anti-scan can particularly be applied in systems with a large field of view (FOV). For large FOV, e.g. of 100 μm×100 μm and above, the scan of the primary beam also deflects the signal beam. Without compensation thereof, this deflection of the signal beam results in a movement of the signal beam on the detector, which means that the detection result will not be uniform but will depend on the beam position in the FOV. Such a movement will particularly be noticeable, when the entire particle optics, which influences the signal beam (e.g., including the objective lens, a beam splitter, a beam bender and a focus lens) magnifies the image scan movement onto the detection element.

According to typical embodiments, for each of the deflection assemblies 901 and 903, a set of at least 4 deflection plates can be provide that can be connected to deflection voltages. The deflection voltages can be synchronized with the image scan of the primary beam and amplified and/or rotated such that deflection of the signal beam generated by primary beam scanning cancels the motion of the signal beam in the sensor plane.

According to some embodiments, a deflection assembly, e.g. a de-scan deflector, can be arranged immediately in front of the suggested detector assembly. According to typical examples, a de-scanning can, however, also be provided as early as possible after secondary particle generation. This establishes a constant axis for the signal beam, which can, thus be more easily aligned to the focus elements of the signal beam. Accordingly, aberrations for the signal beam due to focusing of the signal beam while the signal beam is travelling off-axis of a focusing element can be avoided.

As shown in FIG. 5C, the first deflection assembly 901 can de-scan the signal beam and align the signal beam to the focus lens 301. The deflection of the first deflection assembly 901 can introduce a beam tilt with respect to the optical axis of the signal beam. This beam tilt can be compensated for by the second deflection assembly 903. The second deflection assembly can further improve alignment on the electrode arrangement.

A secondary electron beam 405 passes through an opening 410 in an objective lens 10 and an opening in a plate 520 to enter a sector 440. Sector 440 has a negatively-charged U-bend 535 and a positively-charged U-bend 525 serving to bend the secondary-electron beam 405. Further, a pair of sector side plates are provided. Secondary electron beam 405 is then aligned as it passes through an SE alignment quadrupole element 445 and is focused as it passes through an SE focusing lens 301. Secondary electron beam 405 then passes through openings in grounded plate 455 and in SE optics 200 to an electron detector assembly 220.

A drawback of the cylindrical sector without side plates is that it focuses the SE beam in one plane (up and down on the page) and not the other (in and out of the page). This lack of focusing can be compensated by placing electrodes on the sides of the cylindrical sector to force focusing action in this plane. There are two motivations for the uniform focusing action of the sector. One is to provide for a small spot on the high-speed detector and the other is to enable good energy filtering because the filter is sensitive to both energy and direction of the secondary beam.

Thus, the filter should be located approximately in a focus of the secondary electrons.

Figure 6:
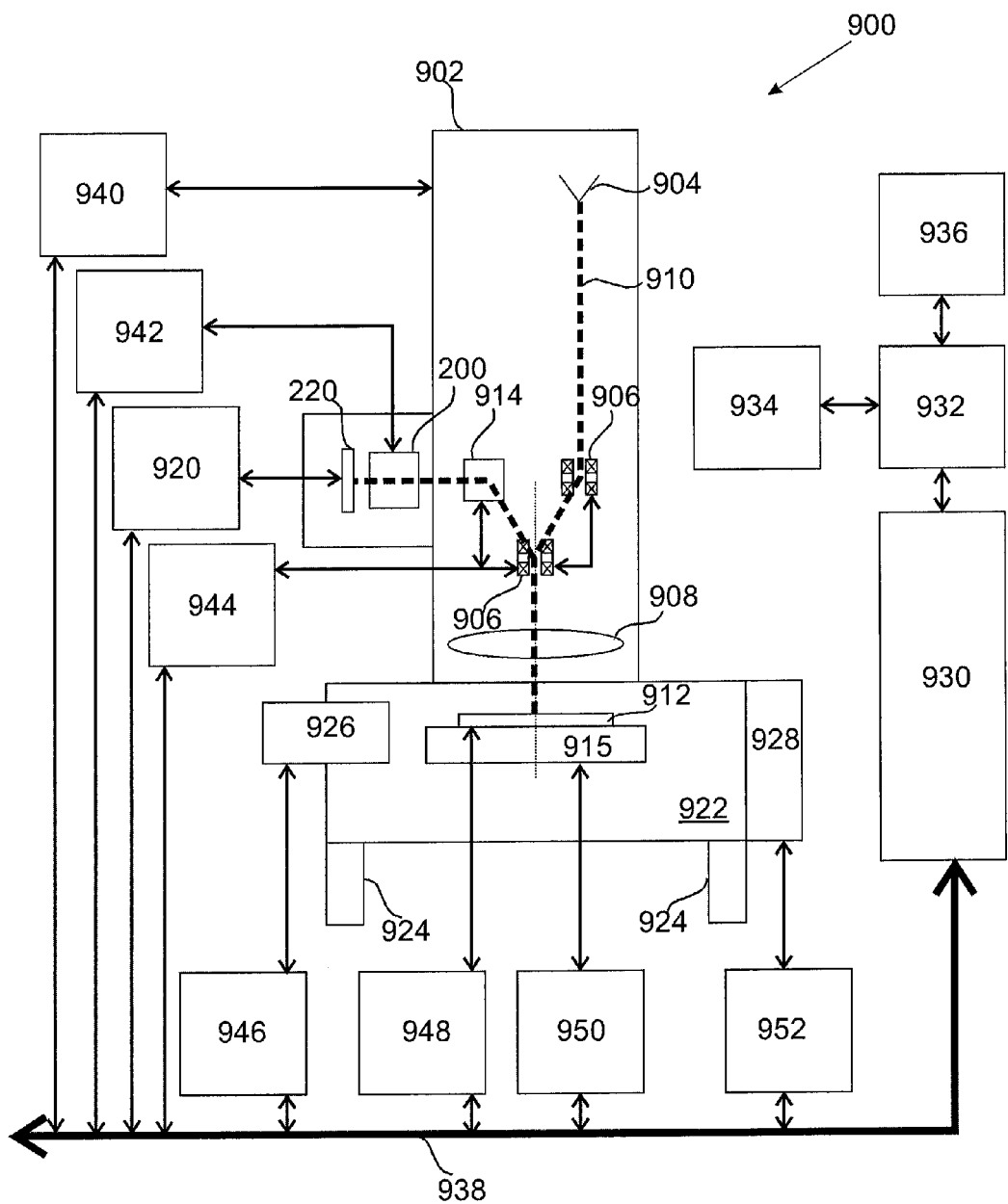
FIG. 6 shows a schematic side view of a charged particle beam device according embodiments described herein.

FIG. 6 is a schematic illustration of a wafer inspection system 900 in accordance with an embodiment of the invention, employing an electron-optical subsystem as described above with reference to FIGS. 2-5. An electron beam column 902 includes an e-beam source 904, magnetic beam separator 906 and objective lens 908 for applying a primary beam 910 to a wafer 912 carried on an x-y stage 915. Secondary electrons from wafer 912 pass through beam separator 906, sector 914, and focusing and deflecting elements 200 to detector 220. The signals from detector 220 is supplied to imaging electronics 920.

Wafer 912 and stage 915 are contained in a vacuum chamber 922 supported on an isolation frame 924. Vacuum pumps 926 maintain a suitable vacuum in the chamber 922 and column 902 during operation. Wafer 912 is placed in and removed from chamber 922 by a wafer handler subsystem 928.

Wafer inspection system 900 is controlled by a computer system 930 having a control processor, image processor and image memory, for example. Computer system 930 is in communication with a workstation 932 having input/output devices 934 such as a keyboard and a pointing device or other suitable devices permitting human interaction, and a display 936. Control processor 930 communicates via a bus 938 with control circuits, such as, PE-beam control 940 which regulates the primary-electron beam 910, SE optics control 942 which controls the focusing and deflection elements of column 902 to provide a suitable secondary-electron beam on detector 220, PE alignment and deflection control 944 which controls the application of primary beam 910 on wafer 912, the vacuum pumps' control 946 for controlling vacuum pumps 926, wafer voltage control 948, stage control 950, and handler control 952. Control processor 930 also receives imaging data via bus 938 from imaging electronics 920 for storage, processing and image analysis.

Figure 7:
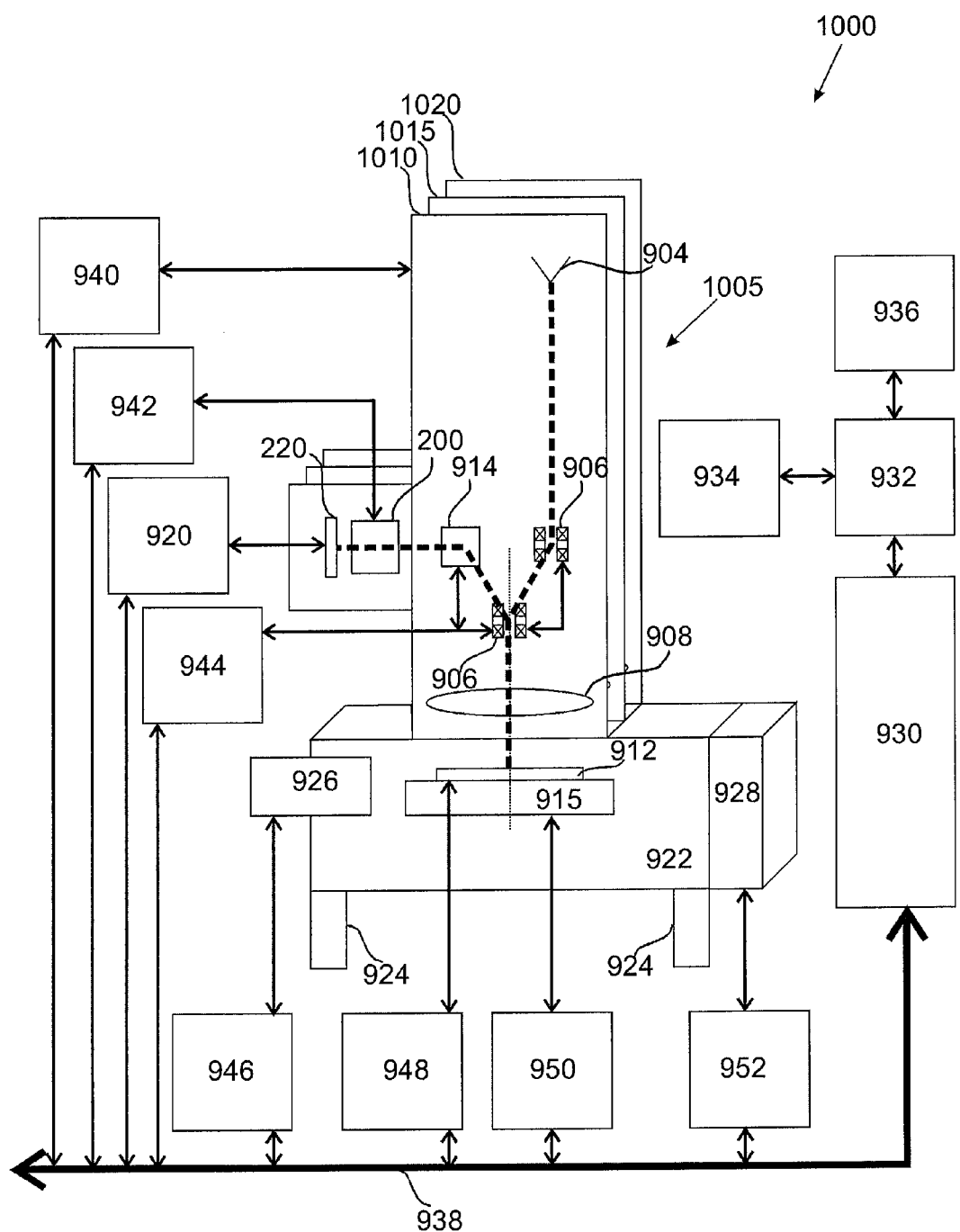
FIG. 7 shows a schematic side view of a charged particle multi-beam device according to embodiments described herein.

To provide for greater throughput than is possible with single-column systems, multi-column systems are also contemplated. FIG. 7 shows schematically a multi-column e-beam wafer-inspection system 1000 having a row 1005 of e-beam columns 1010, 1015, 1020 to enable simultaneous inspection of multiple regions of a wafer 912.

Within FIG. 7, a multi-column device including three sub-units is shown. As will be understood by a person skilled in the art any suitable other number can be applied. For example 5, 10 or 15 electron beams can be arranged in a row.

Further, it is possible to position several rows next to each other. Thereby, an array of electron beams impinging on a specimen is realized. In order to have sufficient space for the separated charged particle beams two rows can typically be arranged next to each other, for example. Nevertheless, if no space-restrictions are present, 3, 5 or any other suitable number rows may be applied as well.

For arranging several sub-columns in a line, in an array or in any other pattern, some of the components, that are usually acting individually on a single electron beam in the case of a single-beam column, may be combined. Thus, one emitter array emits all electron beams or one objective lens focuses all beams of the multi-beam device. Examples are given in the following.

Figure 8:
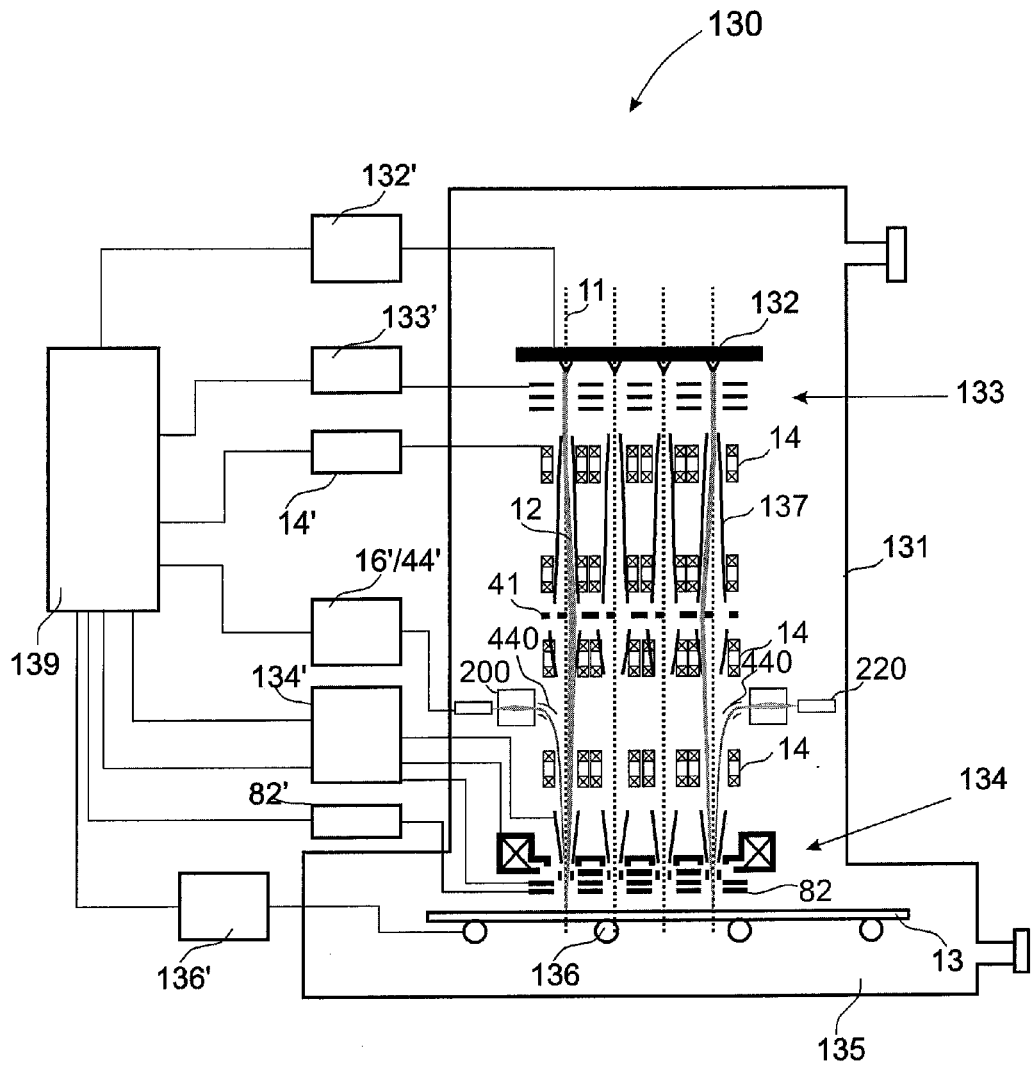
FIG. 8 shows a schematic side view of a charged particle multi-beam device according to embodiments described herein.

A further embodiment arraying multiple beams is shown in FIG. 8. Therein, additional multi-apertures are provided for each beam. Thus, different apertures can be selected using deflectors. Additional details relating to the selection of aperture openings of multi-apertures, as disclosed in European Application Nr. 03 00 6716 assigned to the same assignee as the present application, may also be utilized.

Device 130 has a housing 131 and a specimen chamber 135. The housing as well as the specimen chamber can be evacuated through vacuum ports. Within the specimen chamber, specimen 13 is located on specimen stage 136, which can move the specimen independently in two directions. For control of the specimen, movement control unit 136' is connected to specimen stage 136. Each of the four electron beams 12 has its own optical axis 11. The beams are emitted by an emitter array 132. The emitter array is controlled by control unit 132', that is, the beam current, the anode potential and a possible synchronization of the electron beams with the scanning over specimen 13 for each electron beam, respectively, is controlled. A multi-lens system 133 including an Einzel-lens module for each electron beam is used as a condenser lens for the four charged particle beams. The lens system 133 is controlled by control unit 133'. The control units can be connected to a common control 139.

Generally, without referring to the embodiment of FIG. 8, a single-beam or multi-beam column has typically at least two focusing elements for each primary electron beam. It is advantageous if the lenses (or at least one) are immersion lenses to allow the electron beam to be on a higher potential (beam boost potential) between the lenses. Further, according to one alternative, a combined gun-condenser lens is preferred for shaping the emitted beam.

For focusing the electron beams on specimen 13, a magnetic electrostatic compound lens 134 is used for all electron beams. Thereby, magnetic sub-lenses share a common excitation coil and for each electron beam an electrostatic sub-lens is integrated in the compound lens. The components of the magnetic electrostatic compound lens are controlled by control unit 134'.

Within FIG. 8, the electrostatic lens 133 and the magnetic electrostatic compound lens 134 are used exemplarily. Instead, two electrostatic-lenses could be used, namely as a condenser lens and as an objective lens. Alternatively, two magnetic electrostatic compound lenses could be used, namely as a condenser lens and as an objective lens. However, it is also possible that no condenser lens is required and only one multi-beam lens is used. Thereby, an electrostatic lens or a magnetic electrostatic compound lens could be used. Further, a proximity electrode 82 and a respective control unit 82' are provided, whereby an extraction field corresponding to each of the four electron beams is realized. Additionally, for each electron beam 12, electrodes 137 for providing a beam boost potential are provided. Beyond the above-mentioned components, a deflection-switch system is provided for each electron beam.

Contrary to the magnetic deflection systems shown in FIGS. 4A to 4D, the combination of 4 deflectors allows for an optical axis of the objective lens sub-units that is in common with the optical axis of the emitter sub-units. First deflection stages 14 deflect electron beams 12 to the left or to the right, depending on the kind of aperture used within aperture unit 41. For each electron beam, aperture unit 41 comprises a large aperture for a high current measurement mode and a small aperture for a high resolution measurement mode.

Secondary electrons are separated from the primary electron beams by sectors 440, which are provided for each electron beam. The beam separation of the schematic drawing of FIG. 8 is illustrated within the plane of the figure. This is done for the sake of easier drawing only. Generally, the beam separation and thus, the arrangement of the detection units can also be realized in a dimension orthogonal to the plane of the figure.

For detection of the secondary electrons a focusing and deflection optics 200 is provided. All detection units are controlled by controller 16'/44', whereas each deflection stage 14 is controlled by control unit 14'.

While the foregoing is directed to embodiments of the invention, other and further embodiments of the invention may be devised without departing from the basic scope thereof, and the scope thereof is determined by the claims that follow.

The invention claimed is:

1. A secondary charged particle detection device for detection of a signal beam, comprising:
   a detector arrangement having at least two detection elements with active detection areas, wherein the active detection areas are separated by a gap;
   a particle optics configured for separating the signal beam into a first portion of the signal beam and into at least one second portion of the signal beam, configured for focusing the first portion of the signal beam, and configured for deflecting and focusing the at least one second portion of the signal beam, wherein the particle optics comprises:
   a first electrode; and
   at least one second electrode,
   wherein the first electrode is an inner electrode and the at least one second electrode is provided radially outward of the first electrode.

2. The detection device according to claim 1, wherein the at least one second portion of the signal beam is a second, a third, a fourth and a fifth portion of the signal beam the particles optics is configured for separating the signal beam in the first to fifth portion.

3. The detection device according to claim 1, wherein the at least one second electrode is at least one outer electrode and two or more separating walls.

4. The detection device according to claim 3, wherein the at least one second electrode is at least one outer electrode and four separating walls.

5. The detection device according to claim 3, wherein the at least one outer electrode is separated into at least 4 portions, which are electrically insulated.

6. The detection device according to claim 1, wherein the first electrode and the at least one second electrode is connected to a power supply assembly for biasing of the respective electrode.

7. The detection device according to claim 1, wherein the first electrode is tube-shaped.

8. The detection device according to claim 7, wherein the first electrode cylindrically-shaped or cone-shaped.

9. The detection device according to claim 1, wherein the at least one second electrode is one or more bended electrodes.

10. The detection device according to claim 1, wherein the first electrode and the at least one second electrode have a length along an axis of the signal beam of 10 mm or above.

11. The detection device according to claim 1, wherein the detection elements are PIN diodes.

12. The detection device according to claim 11, wherein the PIN diodes have an active detection area of 1 mm$^2$ to 5 mm$^2$.

13. A charged particle beam device, comprising:
    a charged particle beam source for providing a primary charged particle beam;
    a first focusing element for focusing the primary charged particle beam on the specimen, wherein a signal beam is generated; and
    a charged particle detection device for detection of a signal beam, the detection devices comprises:
        a detector arrangement having at least two detection elements with active detection areas, wherein the active detection areas are separated by a gap;
        a particle optics configured for separating the signal beam into a first portion of the signal beam and into at least one second portion of the signal beam, configured for focusing the first portion of the signal beam, and configured for deflecting and focusing the at least one second portion of the signal beam, wherein the particle optics comprises:
            a first electrode; and
            at least one second electrode,
        wherein the first electrode is an inner electrode and the at least one second electrode is provided radially outward of the first electrode.

14. The charged particle beam device according to claim 13, wherein the at least one second electrode is at least one outer electrode and two or more separating walls.

15. The charged particle beam device according to claim 14, wherein the at least one second electrode is at least one outer electrode and four separating walls.

16. The detection device according to claim 13, wherein the first electrode and the at least one second electrode have a length along an axis of the signal beam of 10 mm or above.

17. A charged particle multi-beam device comprising:
    at least two charged particle beam devices, wherein each charged particle beam device comprises:
        a charged particle beam source for providing a primary charged particle beam;
        a first focusing element for focusing the primary charged particle beam on the specimen, wherein a signal beam is generated; and
        a charged particle detection device for detection of a signal beam, the detection devices comprises:
            a detector arrangement having at least two detection elements with active detection areas, wherein the active detection areas are separated by a gap;
            a particle optics configured for separating the signal beam into a first portion of the signal beam and into at least one second portion of the signal beam, configured for focusing the first portion of the signal beam, and configured for deflecting and focusing the at least one second portion of the signal beam, wherein the particle optics comprises:
                a first electrode; and
                at least one second electrode,
            wherein the first electrode is an inner electrode and the at least one second electrode is provided radially outward of the first electrode.

18. A method of operating a detection device, the method comprising:
    biasing a first electrode and at least one second electrode of a particle optics, wherein the first electrode is an inner electrode and the at least one second electrode is provided radially outward of the first electrode,
    detecting a signal beam with a detector assembly having at least one detection element corresponding to the inner electrode and at least one detection element corresponding to the at least one outer electrode.

19. The method according to claim 18, wherein the detecting is conducted with a bandwidth of 1 GHz or above.

20. A method according to claim 18, the method further comprising:
    focusing the signal beam.

* * * * *